United States Patent [19]

Hayashi et al.

[11] 4,332,874
[45] Jun. 1, 1982

[54] PHOTOSENSITIVE BIS-AZIDE COMPOSITION WITH ACRYLIC TERPOLYMER AND PATTERN-FORMING METHOD

[75] Inventors: Nobuaki Hayashi, Hachioji; Motoo Akagi, Hinodemachi; Kiyoshi Miura, Mobara; Yoshiyuki Odaka, Isumimachi, all of Japan

[73] Assignee: Hitachi, Ltd., Tokyo, Japan

[21] Appl. No.: 200,265

[22] Filed: Oct. 24, 1980

[30] Foreign Application Priority Data

Oct. 24, 1979 [JP] Japan ................................ 54-136413

[51] Int. Cl.$^3$ .......................... G03C 1/71; G03C 1/78; G03C 5/00
[52] U.S. Cl. ........................................ 430/28; 430/25; 430/29; 430/196; 430/197; 430/281; 430/283; 430/325; 430/919
[58] Field of Search .................. 430/28, 25, 197, 196, 430/325, 919, 281, 283, 195, 29

[56] References Cited

U.S. PATENT DOCUMENTS

| | | | |
|---|---|---|---|
| 3,694,383 | 9/1972 | Azami et al. | 430/195 |
| 3,748,132 | 7/1973 | Arcesi et al. | 430/281 |
| 3,892,570 | 7/1975 | Monahan | 430/281 |
| 3,917,794 | 11/1975 | Akagi et al. | 430/25 |
| 4,086,090 | 4/1978 | Kohashi et al. | 430/325 |
| 4,191,571 | 3/1980 | Nonogaki et al. | 430/325 |
| 4,241,162 | 12/1980 | Hatano et al. | 430/195 |

*Primary Examiner*—Charles L. Bowers, Jr.
*Attorney, Agent, or Firm*—Craig and Antonelli

[57] ABSTRACT

Disclosed are a photosensitive composition comprising a copolymer comprising acrylamide, diacetone-acrylamide and a sulfonated vinyl monomer, such as sodium p-styrenesulfonate, and a water-soluble aromatic bisazide compound, and a pattern-forming method using this photosensitive composition.

This photosensitive composition has a reciprocity law failure, and when this photosensitive composition is used, the development after light exposure is completed in a short time.

9 Claims, No Drawings

PHOTOSENSITIVE BIS-AZIDE COMPOSITION WITH ACRYLIC TERPOLYMER AND PATTERN-FORMING METHOD

BACKGROUND OF THE INVENTION (1) Field of the Invention

The present invention relates to a photosensitive composition and a pattern-forming method. More particularly, the present invention relates to a photosensitive composition suitable for formation of a phosphor screen of a color picture tube and a pattern-forming method using this photosensitive composition.

(2) Description of the Prior Art

In a so-called black matrix color picture tube, the size of each of phosphor dots on a face plate is smaller than the irradiation areas of scanned electron beams, and a non-luminous light-absorbing substance such as carbon is filled in voids among respective phosphor dots. Also in a so-called black stripe color picture tube where the phosphor is applied in the form of stripes, the size relation between the phosphor stripes and the irradiation areas of scanned electron beams in the lateral direction is the same as described above with respect to the black matrix color picture tube.

As the method for forming these color picture tubes, there has been adopted, for example, a post-etching method. According to this known post-etching method, dots of a photosensitive composition is prepared at positions, in which a phosphor of a phosphor screen is to be arranged, by using a shadow mask having a small hole diameter, voids among the respective dots are filled with a non-luminous light-absorbing substance and the dots are peeled and removed, and then, red, green and blue phosphors are filled in sequence to form a phosphor screen. Separately, the above-mentioned shadow mask is etched with an acid or the like to increase the hole diameter and the shadow mask is assembled in a color picture tube. This method, however, is still defective in that the hole shape is deformed at the step of etching the shadow mask or distortion is caused in the mask at the heat treatment to be carried out after the etching treatment.

As another conventional method, there has been proposed an optical method not conducting the post-etching treatment, for example, a method using a rotary light source. This method is advantageous in that etching of the shadow mask after formation of a phosphor screen need not be carried out. However, this method still involves problems to be solved. For example, a special light source is inevitably used, and if the hole diameter of the shadow mask is increased beyond a certain level, the portion between two dots is irradiated redundantly and therefore, the irradiation quantity exceeds a level corresponding to the minimum degree of cross-linkage of the photosensitive composition, with the result that the two dots are interconnected to each other. One of the inventors of the present invention has already proposed a pattern-forming method suitable for formation of such phosphor screen, in which the above disadvantage is eliminated, in the specification of U.S. Pat. No. 4,086,090. According to this method, a photosensitive composition comprising an acrylamide/diacetone-acrylamide copolymer (hereinafter referred to as "AA/DAA copolymer") and a water-soluble aromatic bisazide compound is used to form a pattern having an area substantially equal to or smaller than the irradiation area. According to this method, a phosphor screen free of interconnection of dots can be prepared by using a shadow mask having a large hole diameter from the beginning without conducting the post-etching treatment.

The reason why such method is possible is that the above photosensitive composition has a reciprocity law failure. By the term "reciprocity law failure" is meant the characteristic in which the following relation is established among the intensity i of light radiated on the photosensitive composition, the exposure time t and the resulting degree B of cross-linkage:

$$B = f(i \cdot t^p)$$

wherein p is Schwarzschild's constant which is in the range of $0 < p < 1$.

In ordinary photosensitive compositions, p is equal to 1 and the relation of $B = f(i \cdot t)$ is established.

Practically, as the value of p is smaller than 1, occurrence of interconnection of dots is more reduced and dots having a desirable size can be advantageously formed. A preferred range of p is $0 < p < 0.76$, and it is preferred that irradiation be carried out under this condition.

This method is an excellent method for forming phosphor screens, and the above photosensitive composition has a high sensitivity and is very suitable for use in carrying out the above method.

However, this photosensitive composition is still insufficient in that a relatively long time is required for development.

SUMMARY OF THE INVENTION

It is a primary object of the present invention to provide an improved photosensitive composition and a pattern-forming method using this improved photosensitive composition.

Another object of the present invention is to provide a photosensitive composition having a reciprocity law failure, which is excellent in the photosensitivity and development characteristics, and a pattern-forming method using this photosensitive composition.

These and other objects can be attained by a photosensitive composition comprising a copolymer comprising acrylamide (hereinafter referred to as "AA"), diacetoneacrylamide (hereinafter referred to as "DAA") and a sulfonated vinyl monomer and a water-soluble photosensitive aromatic bisazide compound and a method using this photosensitive composition.

When the above photosensitive composition is used, the development time can be shortened without reduction of the photosensitivity characteristics, which results in attainment of not only the effect of shortening the development time but also the effect of saving the amount of warm water used for development.

DETAILED DESCRIPTION OF THE PREFERRED EMBODIMENTS

As the above-mentioned copolymer used as one component of the photosensitive composition of the present invention, there is preferably chosen a copolymer in which the monomer molar ratio of AA to DAA is 1.0 to 3.0 and the monomer molar ratio of the sulfonated vinyl monomer to DAA is 0.01 to 0.4. A copolymer in which the monomer molar ratio of the sulfonated vinyl monomer is 0.01 to 0.15 is especially preferred. The reason is that if the molar ratio of the sulfonated vinyl monomer is at least 0.01, the solubility of the copolymer is improved, but if this molar ratio exceeds 0.4, the photosensitivity characteristics are reduced and if this molar ratio exceeds 0.15, properties of the film of the copolymer are slightly changed. The amount of AA is determined from the viewpoint of the photosensitivity characteristics.

As the sulfonated vinyl monomer, there can be mentioned, for example, p-styrenesulfonic acid, allylsulfonic acid, methallylsulfonic acid, vinylsulfonic acid, 2-acrylamido-2-methylpropanesulfonic acid and salts thereof such as sodium, ammonium, diethanolamine and N,N',N''-nitrilotrispropionamide salts. In short, a monomer containing a sulfonic acid group or sulfonate group is used. Of course, a mixture containing two or more of these sulfonated vinyl monomers can also be used.

The copolymer can be synthesized, for example, by copolymerizing AA, DAA and the sulfonated vinyl monomer in the form of an aqueous solution in the presence of an initiator such as 2,2'-azobis(2-amidinopropane) hydrochloride or a persulfate, e.g., potassium persulfate or ammonium persulfate or a redox catalyst containing such initiator.

As the water-soluble aromatic bisazide compound, there can be mentioned, for example, 4,4'-diazidobenzylidene-acetophenone-2-sulfonic acid and its salts (disodium salt and the like), 4,4'-diazidostilbene-2,2'-disulfonic acid and its salts, 4,4'-diazidostilbene-γ-carboxylic acid and its salts, and compounds represented by the following general formula:

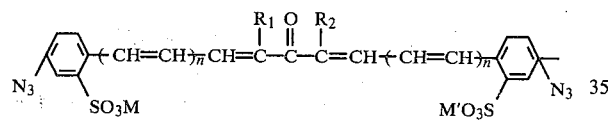

wherein $R_1$ and $R_2$ stand for a hydrogen atom or an alkyl group or $R_1$ and $R_2$ may be bonded together to form a cyclic structure, M and M' stand for an atom or atomic group capable of being converted to a cation in an aqueous solution, such as hydrogen, alkali metal or ammonium, and n is 0 or 1.

As examples of the compound represented by the above general formula, there can be mentioned disodium 4,4'-diazidobenzylideneacetone-2,2'-disulfonate, 1,3-bis(4'-azido-2'-sulfobenzylidene) butanone disodium salt, 2,6-bis(4'-azido-2'-sulfobenzylidene-cyclohexanone) disodium salt, 2,6-bis(4'-azido-2'-sulfobenzylidene)-4-methylcyclohexanone disodium salt, 2,5-bis(4'-azido-2'-sulfobenzylidene)cyclopentanone disodium salt (n is 0 in the foregoing compounds), disodium 4,4'-diazidocinnamylideneacetone-2,2'-disulfonate, 2,6-bis(4'-azido-2'-sulfocinnamylidene)cyclohexanone disodium salt, 2,6-bis(4'-azido-2'-sulfocinnamylidene)-4-methylcyclohexanone disodium salt and 2,5-bis(4'-azido-2'-sulfocinnamylidene)-cyclopentanone disodium salt (n is 1 in the foregoing compounds).

A mixture of two or more of these bisazide compounds can be used in the present invention. These bisazide compounds are disclosed in the above-mentioned U.S. Pat. No. 4,086,090 and U.S. Pat. No. 4,191,571.

It is preferred that such bisazide compound be used in an amount of 1 to 50% by weight based on the copolymer. When the amount of the bisazide compound is smaller than 1% by weight based on the copolymer, the photosensitivity is insufficient, and if the amount of the bisazide compound exceeds 50% by weight, the properties of the resulting film are not good.

To the photosensitive composition of the present invention, a water-soluble polymeric compound compatible with the above-mentioned copolymer may further be added. If such polymeric compound is added, an aqueous solution of the photosensitive composition for formation of a coating film is improved in the properties required for a paint, such as the flowability and adaptability to the coating operation, and the properties of the resulting coating film are improved. This polymeric compound is added so that the photosensitivity characteristics of the photosensitive composition such as the reciprocity law failure are not or hardly influenced. For this reason, it is preferred that the polymeric compound be added in an amount of 1 to 50% by weight, especially 1 to 20% by weight, based on the copolymer.

As such polymeric compound, there can be used, for example, homopolymers such as carboxymethyl cellulose, hydroxymethyl cellulose, sodium poly-L-glutamate, gelatin, polyacrylamide, poly(methyl vinyl ether), poly(vinyl alcohol), poly(vinyl acetal) and poly(ethylene oxide), and copolymers such as an acrylamide/vinyl alcohol copolymer and a maleic acid/vinylmethyl ether copolymer.

In order to improve the properties required for the paint and the properties of the resulting coating film, ethylene glycol, sorbitol or a surface active agent may be added to the photosensitive composition of the present invention. It is known that these compounds can be added in order to improve these properties, and some additives are disclosed in the above-mentioned U.S. Pat. No. 4,086,090. Such improvement is also included within the scope of the present invention. As the surface active agent, there can be mentioned, for example, polyoxyethylene alkyl ether type and polyoxyethylene alkylphenol ether type compounds such as polyoxyethylene lauryl ether, polyoxyethylene cetyl ether, polyoxyethylene stearyl ether, polyoxyethylene octyl ether and polyoxyethylene nonylphenol ether, and sorbitan fatty acid ester type compounds, polyoxyethylene sorbitan fatty acid esters, polyoxyethylene acyl ester type compounds and fatty acid monoglyceride type compounds.

In order to improve the adhesion of the resulting coating film to glass, a small amount of an adhesion accelerator may be incorporated into the photosensitive composition of the present invention. Also this feature has already been disclosed in the above-mentioned U.S. Pat. No. 4,086,090. As the adhesion accelerator, there may be used, for example, water-soluble functional alkoxysilanes such as vinyl-tris(β-methoxyethoxy)silane, N-β-(aminoethyl)-aminopropylmethyldimethoxysilane and N-β-(aminoethyl)-γ-aminopropyltrimethoxysilane.

An embodiment of the method for preparing a phosphor screen of a black matrix color picture tube by using the photosensitive composition of the present invention will now be described.

(1) A photosensitive composition is coated on the inner face of a face glass and is then dried.

(2) A shadow mask is attached and light is radiated through beam holes of the shadow mask at positions where dots or stripes of red, green and blue phosphors are to be formed.

(3) The shadow mask is taken out, and development is effected with water to leave dots or stripes of the cured photosensitive composition.

(4) A colloidal suspension of black carbon is coated on the inner face of the face glass and is then dried.

(5) A peeling solution is poured and the cured photosensitive composition is peeled and removed together with carbon adhering to the top face thereof, whereby matrix holes are formed on the carbon film.

(6) Slurries of red, green and blue phosphors are coated in succession, exposed to light and developed to fill the phosphors into the predetermined matrix holes and form dots or stripes of the respective phosphors.

(7) Then, the aluminizing, frit baking and electron gun treatment steps are carried out as in the conventional methods.

The present invention will now be described in detail with reference to the following Examples that by no means limit the scope of the present invention.

EXAMPLE 1

A 2-liter flask equipped with a mechanical stirrer, a condenser, a thermometer and a nitrogen gas inlet tube was charged with 29 g of AA, 41 g of DAA (AA/DAA molar ratio=1.67), 1.4 g of sodium p-styrene-sulfonate (the molar ratio to DAA being 0.03) and 930 g of deionized water, and while the temperature was maintained at 50° C., air in the flask was replaced by nitrogen gas and 5 ml of a 3% aqueous solution of 2,2'-azobis(2-amidinopropane) hydrochloride was added. The reaction mixture was maintained at 50° C. for 6 hours with stirring and taken out. In the reaction product, substantially all the monomers were polymerized. The reaction product was diluted to form a 1.5% aqueous solution of the copolymer having a viscosity of 45 cp.

Sodium 4,4'-diazidostilbene-2,2'-disulfonate was added as a photo-crosslinking agent in an amount of 10% by weight based on the copolymer to form an aqueous solution of a photosensitive composition. The aqueous solution was spin-coated on a face plate and dried, and a shadow mask was attached and light exposures corresponding to red, green and blue three colors were carried out by using a super-high-pressure mercury lamp as a light source. When the photosensitive film was developed for 15 seconds by spraying of warm water maintained at 40° C. under a hydraulic pressure of 2.5 Kg/cm$^2$, the development was completed and dots corresponding to the three colors were obtained.

In the shadow mask used, the hole diameter was 0.35 mm and the mask pitch was 0.62 mm, and the diameter of the obtained dots was 0.26 mm.

COMPARATIVE EXAMPLE

The conventional AA/DAA copolymer (AA/DAA molar ratio=1.67) was used, and in the same manner as described in Example 1, the bisazide compound was added and the treatment was carried out. In this case, 40 seconds were necessary for completion of the development.

EXAMPLE 2

The experiment was carried out in the same manner as described in Example 1 except that the amount of sodium p-styrenesulfonate was changed to 2.8 g (the molar ratio to DAA was 0.06). The viscosity of the obtained copolymer aqueous solution was 55 cp and the development was completed within 15 seconds.

EXAMPLE 3

The experiment was carried out in the same manner as described in Example 1 except that the amount of sodium p-styrenesulfonate was changed to 0.7 g (the molar ratio to DAA was 0.015). The viscosity of the obtained copolymer aqueous solution was 32 cp. For completion of the development, 30 seconds were necessary.

EXAMPLE 4

The same flask as used in Example 1 was charged with 29 of AA, 41 g of DAA (the AA/DAA molar ratio was 1.67), 3.4 g of a 25% aqueous solution of sodium vinylsulfonate (the molar ratio to DAA was 0.03) and 930 g of deionized water, and the treatment was carried out in the same manner as in Example 1.

The viscosity of a 1.5% aqueous solution of the obtained copolymer was 32 cp, and the development was completed in 20 seconds.

EXAMPLE 5

The treatment was carried out in the same manner as described in Example 4 except that 1.0 g of sodium allylsulfonate (the molar ratio to DAA was 0.03) was used instead of sodium vinylsulfonate used in Example 4. The viscosity of a 1.5% aqueous solution of the obtained copolymer was 14 cp. The development time was 20 seconds.

EXAMPLE 6

The same flask as used in Example 1 was charged with 29 g of AA, 41 g of DAA (the AA/DAA molar ratio was 1.67), 1.1 g of sodium methallylsulfonate (the molar ratio to DAA was 0.03) and 930 g of deionized water, and air in the flask was replaced by nitrogen gas and 5 ml of a 1% aqueous solution of 2,2'-azobis(2-amidinopropane) hydrochloride was added. The liquid reaction mixture was maintained at 50° C. for 2 hours and the same amount of the initiator was further added. Polymerization was further conducted for 6 hours and the reaction product was taken out. The viscosity of a 1.5% aqueous solution of the obtained copolymer was 16 cp, and the development time was 20 seconds.

EXAMPLE 7

The same flask as used in Example 1 was charged with 29 g, 41 g of DAA, 1.4 g of sodium 2-acrylamido-2-methylpropanesulfonate (hereinafter referred to as "AMPS-Na") and 930 g of deionized water, and the treatment was carried out in the same manner as described in Example 1. The viscosity of a 1.5% aqueous solution of the obtained copolymer was 28 cp and the development time was 30 seconds.

EXAMPLE 8

The experiment was carried out in the same manner as described in Example 7 except that the amount of AMPS-Na was changed to 2.8 g. The viscosity of a 1.5% aqueous solution of the obtained copolymer was 33 cp, and the development time was 20 seconds.

EXAMPLE 9

The experiment was carried out in the same manner as described in Example 7 except that the amount of AMPS-Na was changed to 7.1 g. The viscosity of a 1.5% aqueous solution of the obtained copolymer was 45 cp and the development time was 15 seconds.

EXAMPLE 10

The experiment was carried out in the same manner as described in Example 7 except that 7.1 g of ammonium 2-acrylamido-2-methylpropanesulfonate was used instead of AMPS-Na. The viscosity of a 1.5% aqueous solution of the obtained copolymer was 45 cp and the development time was 15 seconds.

EXAMPLE 11

The experiment was carried out in the same manner as described in Example 7 except that 10.8 g of diethanolamine 2-acrylamido-2-methylpropanesulfonate was used instead of AMPS-Na. The viscosity of a 1.5% aqueous solution of the obtained copolymer was 32 cp and the development time was 15 seconds.

EXAMPLE 12

The experiment was carried out in the same manner as described in Example 7 except that 15.0 g of 2-acrylamido-2-methylpropanesulfonic acid N,N',N''-nitrilotrispropionamide salt was used instead of AMPS-Na. The viscosity of a 1.5% aqueous solution of the obtained copolymer was 47 cp and the development time was 15 seconds.

EXAMPLE 13

The experiment was carried out in the same manner as described in Example 7 except that 3.2 g of diethanolamine p-styrenesulfonate was used instead of AMPS-Na. The viscosity of a 1.5% aqueous solution of the obtained copolymer was 68 cp and the development time was 20 seconds.

What is claimed is:

1. A photosensitive composition which comprises:
   an admixture of (1) a copolymer prepared by addition polymerization of a monomeric mixture containing acrylamide, diacetoneacrylamide and at least one vinyl monomer containing a sulfonic acid group or salt thereof, with the monomer molar ratio of acrylamide to diacetoneacrylamide being 1.0 to 3.0 and the monomer molar ratio of the at least one vinyl monomer to diacetoneacrylamide being from about 0.01 to 0.4 in the copolymer
   and
   (2) a water-soluble photosensitive aromatic bisazide compound, with the amount of said bisazide compound being 1 to 50% by weight based on the copolymer.

2. A pattern-forming method comprising the steps of forming on a substrate a film of a photosensitive composition comprising:
   an admixture of (1) a copolymer prepared by addition polymerization of a monomeric mixture containing acrylamide, diacetoneacrylamide, and at least one vinyl monomer containing a sulfonic acid group or salt thereof, with the monomer molar ratio of acrylamide to diacetoneacrylamide being 1.0 to 3.0 and the monomer molar ratio of the at least one vinyl monomer to diacetoneacrylamide being from 0.01 to 0.4 in the copolymer and
   (2) a water-soluble photosensitive aromatic bisazide compound, with the amount of the bisazide compound being 1 to 50% by weight based on the copolymer; irradiating the film with a predetermined pattern of light under such conditions that the Schwarzschild's constant p is in the range of $0 < p < 0.76$; and developing the film to form a pattern having an area substantially equal to or smaller than the area of the light irradiation region.

3. A photosensitive composition as set forth in claim 1, wherein the sulfonated vinyl monomer in the copolymer is at least one compound selected from the group consisting of p-styrenesulfonic acid, allylsulfonic acid, methallylsulfonic acid, vinylsulfonic acid and 2-acrylamido-2-methylpropanesulfonic acid, and salts thereof.

4. A photosensitive composition as set forth in claim 1, wherein a water-soluble polymeric compound compatible with said copolymer is incorporated in an amount of 1 to 50% by weight based on the copolymer.

5. A photosensitive composition as set forth in claim 4, wherein the water-soluble polymeric compound is at least one compound selected from the group consisting of carboxymethyl cellulose, hydroxymethyl cellulose, sodium poly-L-glutamate, gelatin, polyacrylamide, poly(vinyl methyl ether), poly(vinyl alcohol), poly(vinyl acetal), poly(ethylene oxide), acrylamide/vinyl alcohol copolymers and maleic acid/vinyl ether copolymers.

6. A pattern-forming method according to claim 2, wherein the photosensitive composition further comprises a water-soluble polymeric compound compatible with said copolymer in an amount of 1 to 50% weight based on said copolymer.

7. A pattern-forming method according to claim 6, wherein the water-soluble polymeric compound is at least one compound selected from the group consisting of carboxymethyl cellulose, hydroxymethyl cellulose, sodium poly-L-glutamate, gelatin, polyacrylamide, poly(vinyl methyl ether), poly(vinyl alcohol), poly(vinyl acetal), poly(ethylene oxide), acrylamide/vinyl alcohol copolymers and maleic acid/vinyl ether copolymers.

8. A pattern-forming method according to claim 2, wherein said substrate is the inner face of a face plate of a color picture tube.

9. A pattern-forming method according to claim 2, wherein the sulfonated vinyl monomer is at least one compound selected from the group consisting of p-styrenesulfonic acid, allylsulfonic acid, methallylsulfonic acid, vinylsulfonic acid and 2-acrylamido-2-methylpropanesulfonic acid, and salts thereof.

* * * * *